(12) United States Patent
Kato

(10) Patent No.: US 10,708,556 B2
(45) Date of Patent: Jul. 7, 2020

(54) IMAGING DEVICE AND IMAGING SYSTEM

(71) Applicant: CANON KABUSHIKI KAISHA, Tokyo (JP)

(72) Inventor: Taro Kato, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 5 days.

(21) Appl. No.: 16/113,901

(22) Filed: Aug. 27, 2018

(65) Prior Publication Data
US 2019/0068930 A1 Feb. 28, 2019

(30) Foreign Application Priority Data
Aug. 29, 2017 (JP) ................... 2017-164104

(51) Int. Cl.
H04N 9/04 (2006.01)
H01L 27/146 (2006.01)
G05D 1/02 (2020.01)
H04N 5/3745 (2011.01)
B60R 1/00 (2006.01)

(52) U.S. Cl.
CPC .......... H04N 9/0455 (2018.08); G05D 1/0246 (2013.01); H01L 27/14621 (2013.01); H01L 27/14627 (2013.01); H01L 27/14645 (2013.01); H04N 5/37457 (2013.01); H04N 9/04555 (2018.08); B60R 1/00 (2013.01)

(58) Field of Classification Search
CPC ............. H04N 9/0455; H04N 9/04555; H04N 5/37457; H01L 27/146; H01L 27/14621; H01L 27/14645; H01L 27/14627; G05D 1/0246; B60R 1/00
USPC ........................................................... 348/279
See application file for complete search history.

(56) References Cited

U.S. PATENT DOCUMENTS

| 8,514,309 | B2 | 8/2013 | Kato |
| 8,670,051 | B2 | 3/2014 | Kato |
| 8,885,082 | B2 | 11/2014 | Noda |
| 9,093,345 | B2 | 7/2015 | Kato |
| 9,478,575 | B2 | 10/2016 | Kato |
| 9,685,473 | B2 * | 6/2017 | Park ................... H01L 27/14623 |

(Continued)

FOREIGN PATENT DOCUMENTS

| JP | 2007-158692 | 6/2007 |
| JP | 2016-33981 | 3/2016 |

Primary Examiner — Pritham D Prabhakher
(74) Attorney, Agent, or Firm — Venable LLP

(57) ABSTRACT

A disclosed imaging device includes a plurality of pixels arranged over a plurality of rows and a plurality of columns. Each of the plurality of pixels includes a first photoelectric conversion unit, a second photoelectric conversion unit, a third photoelectric conversion unit, a microlens that collects light into the first photoelectric conversion unit, the second photoelectric conversion unit, and the third photoelectric conversion unit, a first color filter through which a light entering the first photoelectric conversion unit passes, a second color filter through which a light entering the second photoelectric conversion unit passes, and a third color filter through which a light entering the third photoelectric conversion unit passes. The first to third photoelectric conversion units are arranged in this order in a first direction, and transmittances of the first color filter and the third color filter are different from a transmittance of the second color filter.

15 Claims, 14 Drawing Sheets

(56) References Cited

U.S. PATENT DOCUMENTS

| | | |
|---|---|---|
| 9,768,217 B2 | 9/2017 | Kawabata |
| 9,831,278 B2 | 11/2017 | Kato |
| 9,917,134 B1 * | 3/2018 | Hsieh ................ H01L 27/14685 |
| 10,008,528 B2 | 6/2018 | Ikahura |
| 10,063,765 B2 | 8/2018 | Kato |
| 10,204,946 B1 * | 2/2019 | Boettiger .......... H01L 27/14645 |
| 2014/0035086 A1 | 2/2014 | Kato |
| 2015/0271461 A1 * | 9/2015 | Hayashi .................. H04N 9/07 |
| | | 348/223.1 |
| 2015/0326838 A1 * | 11/2015 | Kawai .................. H04N 9/045 |
| | | 348/280 |
| 2016/0037117 A1 | 2/2016 | Ono |
| 2016/0315112 A1 * | 10/2016 | Park ................. H01L 27/14623 |
| 2017/0111618 A1 * | 4/2017 | Hsieh ..................... G02B 3/005 |
| 2017/0261368 A1 * | 9/2017 | Nam ..................... G01J 1/0488 |
| 2017/0324915 A1 * | 11/2017 | Geurts ................ H04N 5/3532 |
| 2017/0345853 A1 | 11/2017 | Kato |
| 2018/0006071 A1 | 1/2018 | Kato |
| 2018/0213205 A1 * | 7/2018 | Oh .................... H01L 27/14634 |
| 2018/0315791 A1 * | 11/2018 | Hsieh ................. H01L 27/14627 |
| 2019/0045111 A1 * | 2/2019 | Galor Gluskin ... H04N 5/23235 |
| 2019/0051688 A1 * | 2/2019 | Boettiger .......... H01L 27/14645 |

* cited by examiner

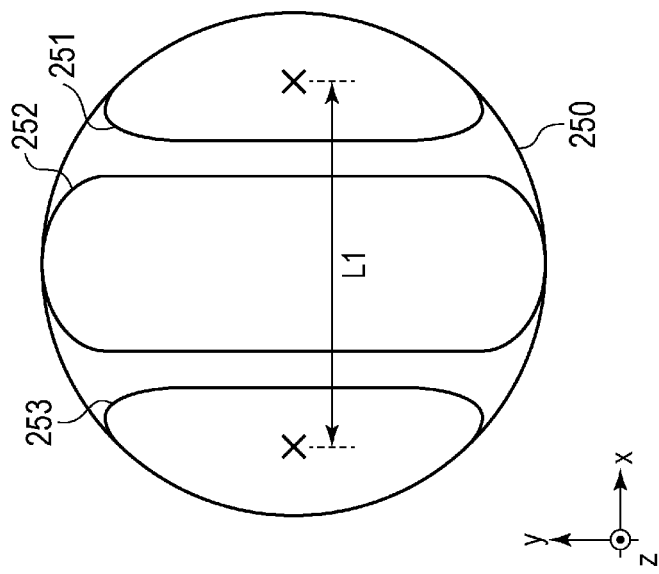
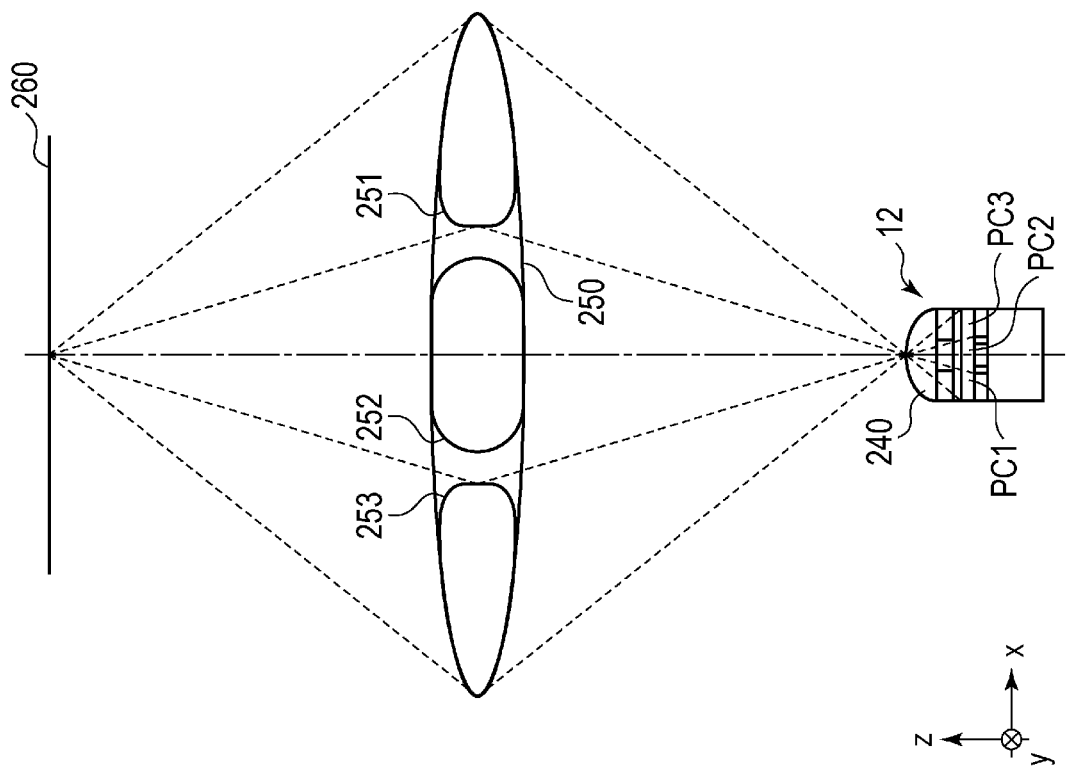

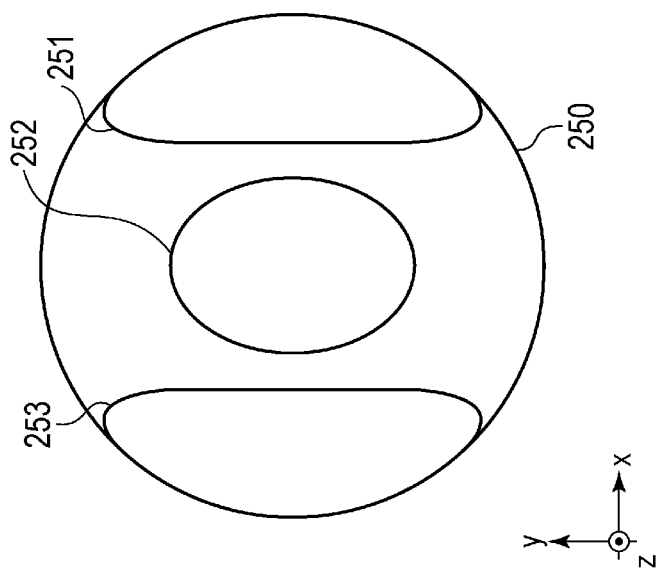
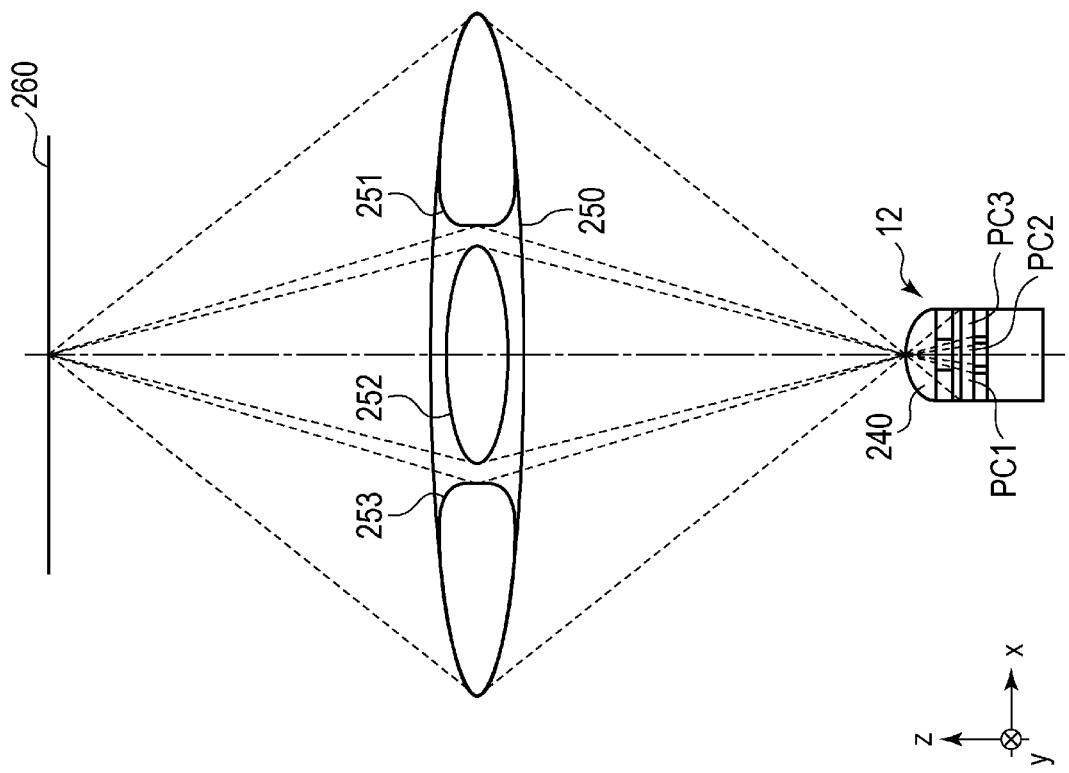

IMAGING DEVICE AND IMAGING SYSTEM

BACKGROUND OF THE INVENTION

Field of the Invention

The present invention relates to an imaging device and an imaging system. Description of the Related Art Imaging systems having the autofocus (AF) function of automatically performing focus adjustment when capturing an image have been widespread. As an imaging device mounted in such an imaging system, Japanese Patent Application Laid-Open No. 2007-158692 discloses an imaging device that performs focus detection by a phase difference scheme by using a signal from a photoelectric conversion unit used for focus detection provided in some of unit pixels. Further, Japanese Patent Application Laid-Open No 2016-033981 discloses an imaging device that is a so-called stacked type imaging device in which photoelectric conversion units are arranged on a substrate and performs focus detection by a phase difference scheme. The focus detection of a so-called imaging plane phase difference scheme as disclosed in Japanese Patent Application Laid-Open No. 2007-158692 and Japanese Patent Application Laid-Open No 2016-033981 is to calculate the defocus amount or the distance to an object based on a phase difference of parallax images caused by light fluxes that have passed through different regions on a pupil of an imaging lens (pupil regions) by using the principle of triangulation.

In imaging devices used for an on-vehicle camera, for the purpose of acquisition of information used for autonomous traveling, it is desired to ensure the ranging performance with high sensitivity or accuracy and increase the depth of field so as not to cause out-of-focus over a whole captured image. In general, however, improvement in the ranging performance and increase in the depth of field are conflicting requirements, and it is difficult for the imaging devices disclosed in Japanese Patent Application Laid-Open No. 2007-158692 and Japanese Patent Application Laid-Open No 2016-033981 to achieve both a high ranging performance and a deep depth of field.

SUMMARY OF THE INVENTION

The present invention intends to provide an imaging device and an imaging system that can achieve both a high ranging performance and a deep depth of field.

According to one aspect of the present invention, there is provided an imaging device including a plurality of pixels arranged over a plurality of rows and a plurality of columns, wherein each of the plurality of pixels includes a first photoelectric conversion unit, a second photoelectric conversion unit, a third photoelectric conversion unit, a microlens that collects light into the first photoelectric conversion unit, the second photoelectric conversion unit, and the third photoelectric conversion unit, a first color filter through which a light entering the first photoelectric conversion unit passes, a second color filter through which a light entering the second photoelectric conversion unit passes, and a third color filter through which a light entering the third photoelectric conversion unit passes, wherein the first photoelectric conversion unit, the second photoelectric conversion unit, and the third photoelectric conversion unit are arranged in this order in a first direction, and wherein a transmittance of the first color filter and a transmittance of the third color filter are different from a transmittance of the second color filter.

Further features of the present invention will become apparent from the following description of exemplary embodiments with reference to the attached drawings.

BRIEF DESCRIPTION OF THE DRAWINGS

FIG. 4A, FIG. 4B, and FIG. 5 are diagrams illustrating positional relationships of a photoelectric conversion unit of each pixel and an exit pupil of a capturing lens in the imaging device according to the first embodiment of the present invention.

FIG. 9A and FIG. 9B are diagrams illustrating positional relationships of a photoelectric conversion unit of each pixel and an exit pupil of a capturing lens in the imaging device according to the second embodiment of the present invention.

DESCRIPTION OF THE EMBODIMENTS

Imaging devices of preferred embodiments of the present invention will now be described in detail in accordance with the accompanying drawings. Note that, for a component with no particular illustration in the present specification and the drawings, a known technology in the field may be applied. Further, each embodiment described below is one of the embodiments of the present invention and not limited thereto.

First Embodiment

Figure 1:
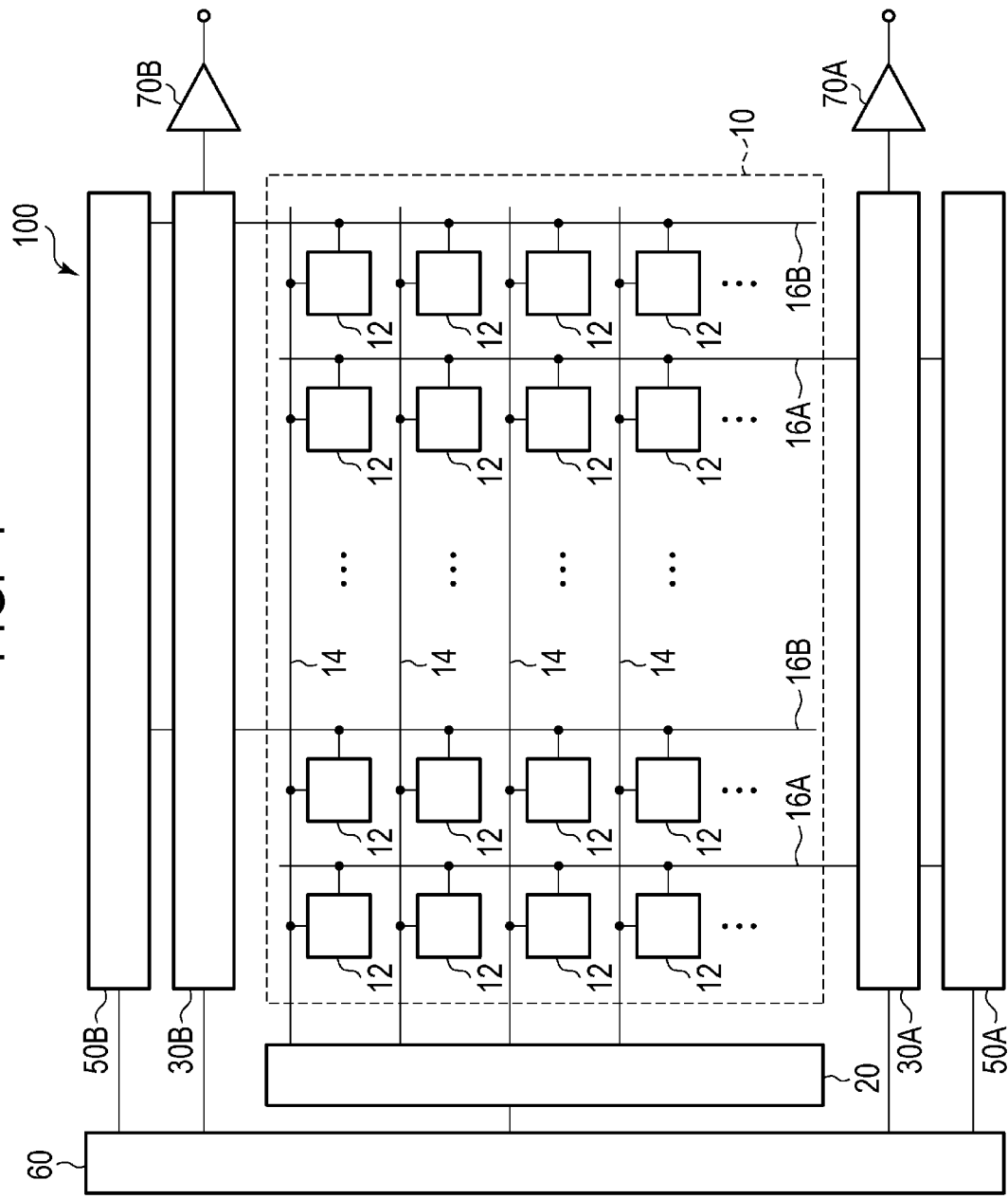
FIG. 1 is a block diagram illustrating a general configuration of an imaging device according to a first embodiment of the present invention.
Figure 2:
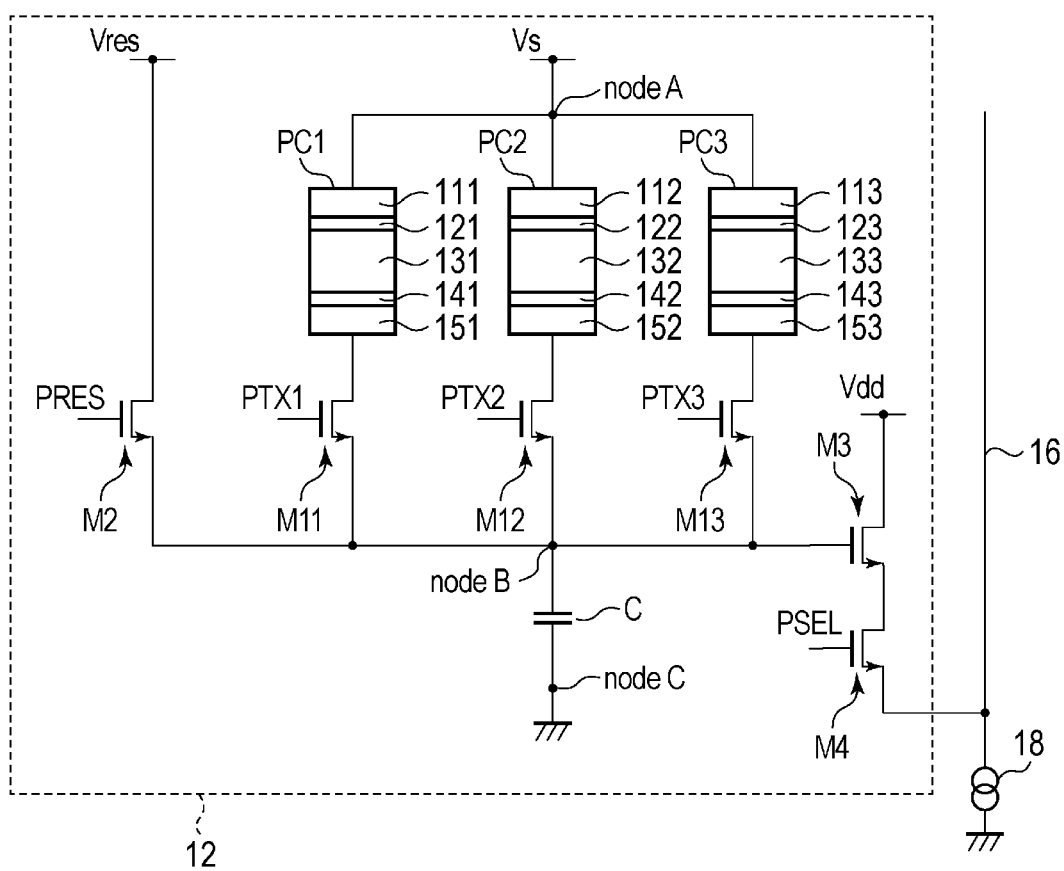
FIG. 2 is a circuit diagram illustrating a configuration example of a pixel of the imaging device according to the first embodiment of the present invention.
Figure 3A:
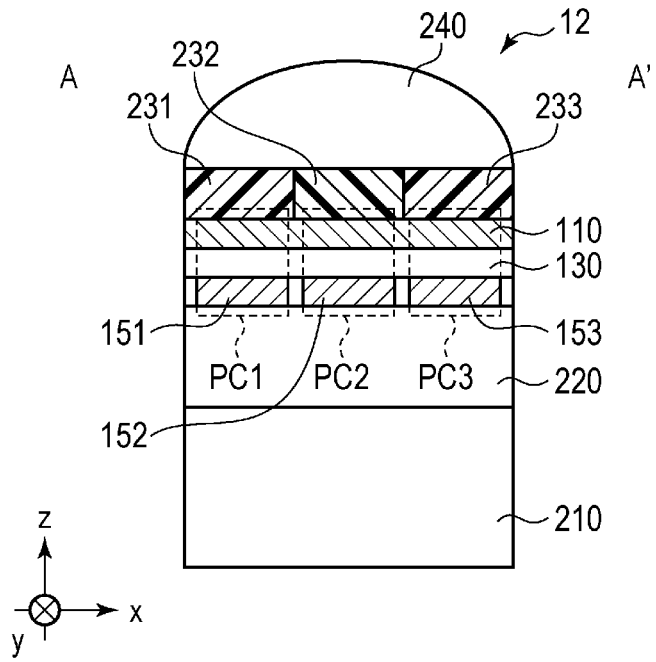
FIG. 3A is a cross-sectional view illustrating the structure of the pixel of the imaging device according to the first embodiment of the present invention.
Figure 3B:
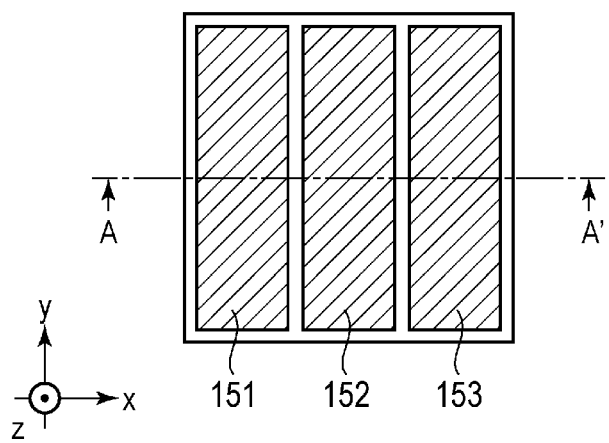
FIG. 3B and FIG. 3C are plan views illustrating the structure of the pixel of the imaging device according to the first embodiment of the present invention.
Figure 3C:
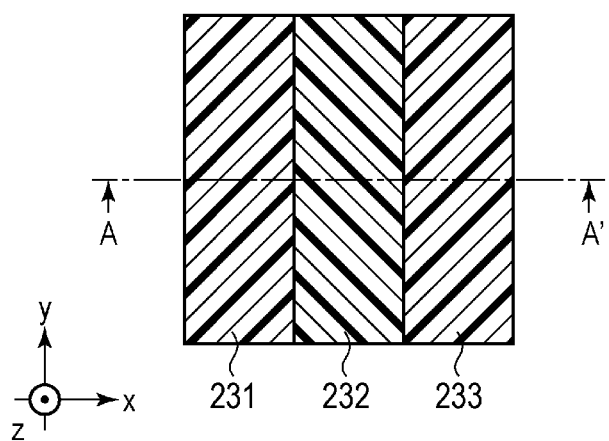
Figure 5:
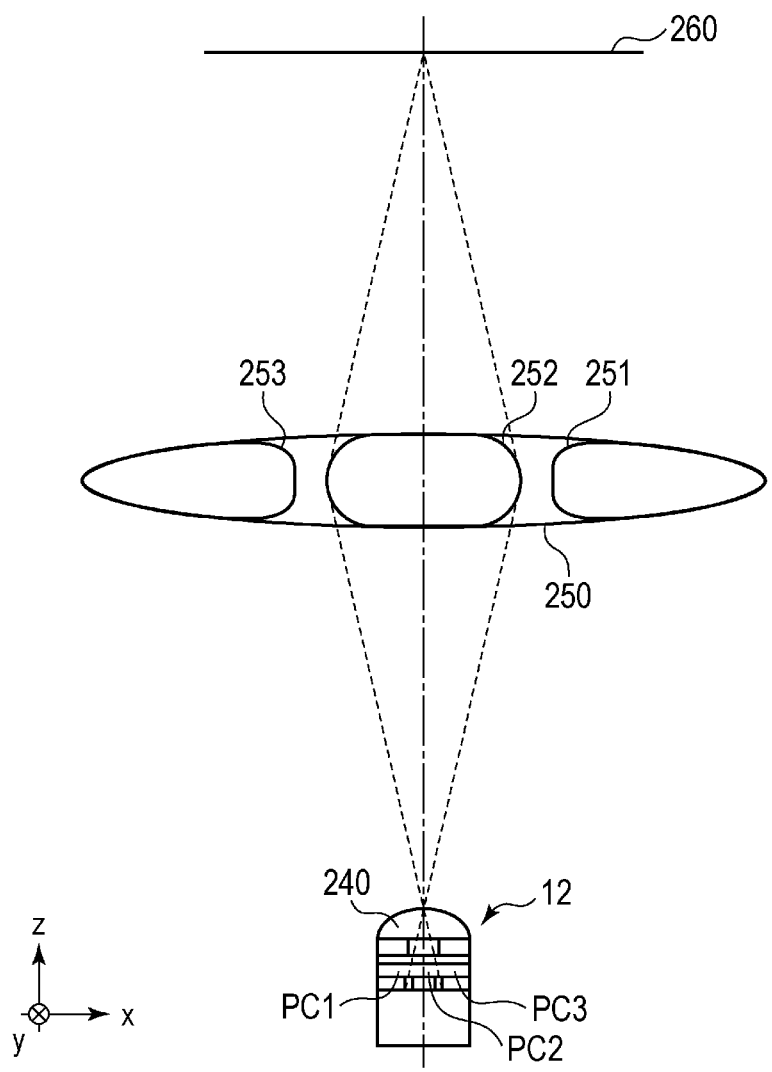
Figure 6A:
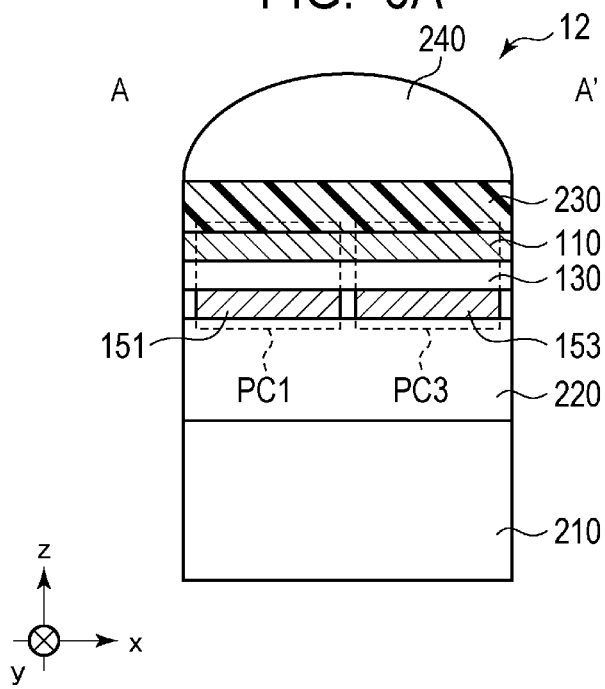
FIG. 6A is a cross-sectional view illustrating the structure of a pixel of an imaging device according to a reference example.
Figure 6B:
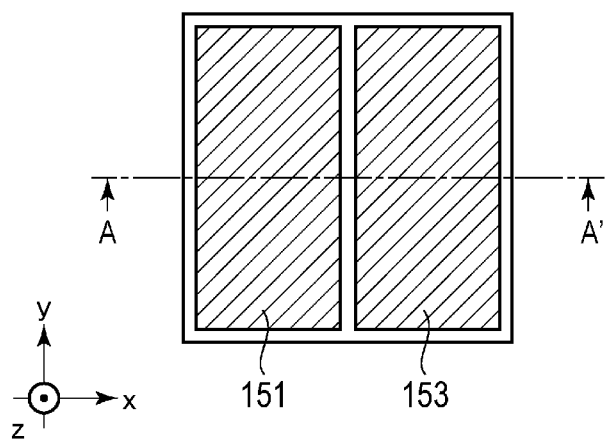
FIG. 6B and FIG. 6C are plan views illustrating the structure of the pixel of the imaging device according to the reference example.
Figure 6C:
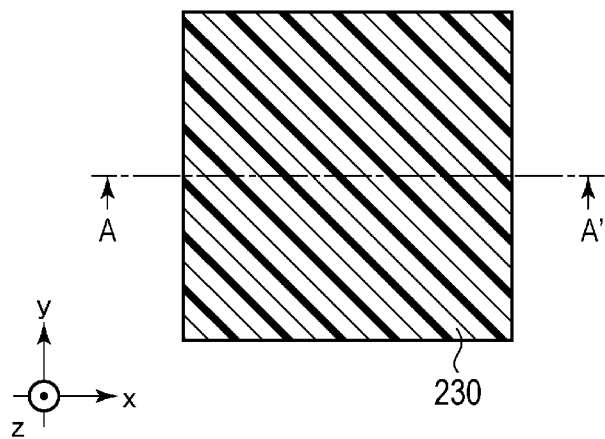
Figure 7B:
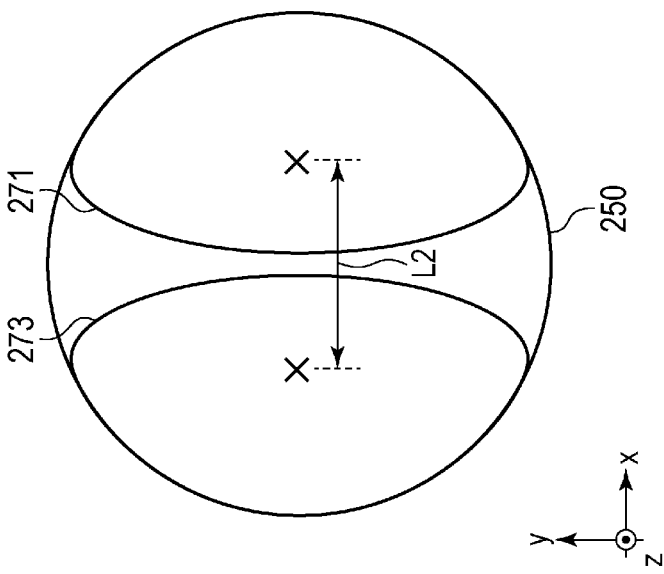
FIG. 7A and FIG. 7B are diagrams illustrating positional relationships of a photoelectric conversion unit of each pixel and an exit pupil of a capturing lens in the imaging device according to the reference example.
Figure 7A:
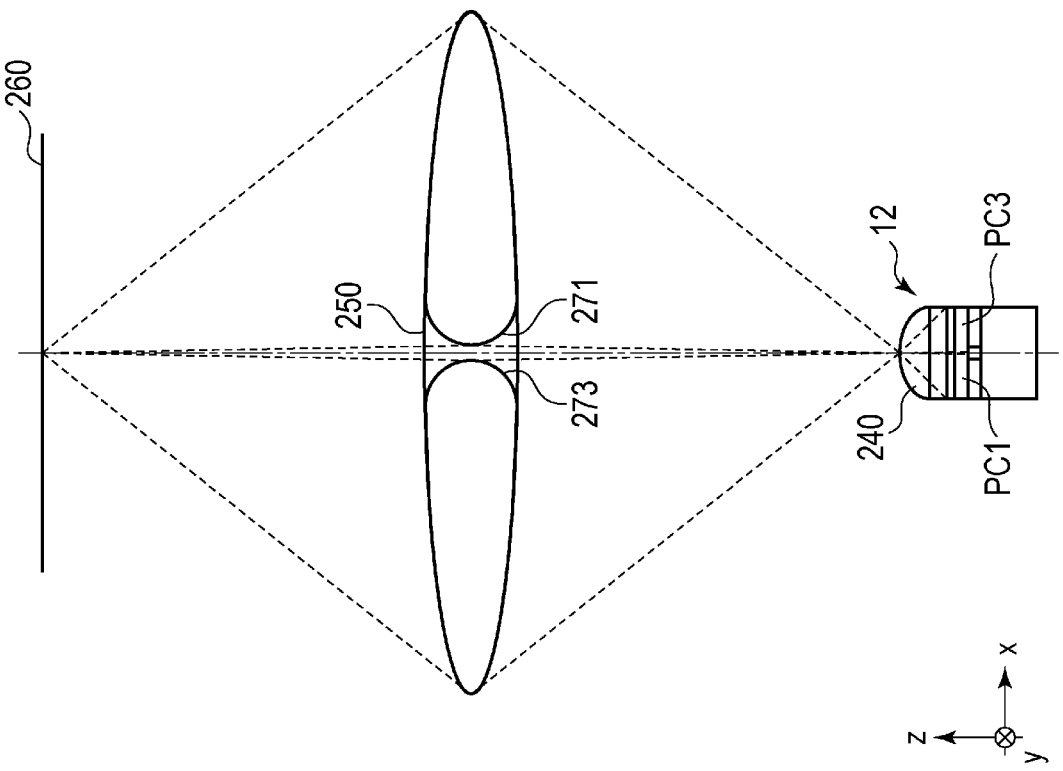

An imaging device according to a first embodiment of the present invention will be described with reference to FIG. 1 to FIG. 7B. FIG. 1 is a block diagram illustrating a general configuration of an imaging device according to the present embodiment. FIG. 2 is a circuit diagram illustrating a configuration example of a pixel of the imaging device according to the present embodiment. FIG. 3A to FIG. 3C are a cross-sectional view and plan views illustrating the structure of the pixel of the imaging device according to the present embodiment. FIG. 4A to FIG. 5 are diagrams illustrating positional relationships of a photoelectric conversion unit of each pixel and an exit pupil of a capturing lens in the imaging device according to the present embodiment. FIG. 6A to FIG. 6C are a cross-sectional view and plan views illustrating the structure of the pixel of the imaging device according to the reference example. FIG. 7A and FIG. 7B are diagrams illustrating positional relationships of a photoelectric conversion unit of each pixel and an exit pupil of a capturing lens in the imaging device according to the reference example.

As illustrated in FIG. 1, the imaging device 100 according to the present embodiment includes a pixel region 10, a vertical scanning circuit 20, readout circuits 30A and 30B, horizontal scanning circuits 50A and 50B, a control circuit 60, and output circuits 70A and 70B.

In the pixel region 10, a plurality of pixels 12 arranged in a matrix over a plurality of rows and a plurality of columns are provided. On each row of the pixel array of the pixel region 10, control lines 14 are arranged extending in the first direction (the horizontal direction in FIG. 1). Each of the control lines 14 is connected to the pixels 12 aligned in the first direction, respectively, and forms a signal line common to these pixels 12. In the present specification, the first direction in which the control line 14 extends may be denoted as a row direction.

Further, on each column of the pixel array of the pixel region 10, the output lines 16A and 16B are arranged in an alternating manner extending in a second direction (the vertical direction in FIG. 1) intersecting the first direction. Each of the output lines 16A and 16B is connected to the pixels 12 aligned in the second direction, respectively, and forms a signal line common to these pixels 12. In the present specification, the second direction in which the output lines 16A and 16B extend may be denoted as a column direction. The plurality of pixels 12 within the pixel region 10 are divided into the pixels 12 connected to the output lines 16A and the pixels 12 connected to the output lines 16B on a column basis.

The vertical scanning circuit 20 is connected to the control lines 14 arranged on respective rows of the pixel region 10. The vertical scanning circuit 20 is a circuit unit that supplies, to the pixels 12 via the control lines 14, control signals used for driving readout circuits inside the pixels 12 when reading out pixel signals from the pixels 12.

The readout circuit 30A is connected to the output lines 16A. The pixel signals read out from the pixels 12 via the output lines 16A are input to the readout circuit 30A. Similarly, the readout circuit 30B is connected to the output lines 16B. The pixel signals read out from the pixels 12 via the output lines 16B are input to the readout circuit 30B. Each of the readout circuits 30A and 30B is a circuit unit that performs predetermined signal processing such as an amplification process, an analog-to-digital (AD) conversion process, an addition process, or the like, for example, on the pixel signals read out from the pixels 12. Each of the readout circuits 30A and 30B may include differential amplifier circuits, sample-hold circuits, AD converter circuits, adder circuits, correlated double sampling (CDS) circuits, or the like.

The horizontal scanning circuit 50A is a circuit unit that supplies, to the readout circuit 30A, control signals used for transferring signals processed in the readout circuit 30A to the output circuit 70A sequentially in a column basis. Similarly, the horizontal scanning circuit 50B is a circuit unit that supplies, to the readout circuit 30B, control signals used for transferring signals processed in the readout circuit 30B to the output circuit 70B sequentially in a column basis.

The output circuit 70A is a circuit unit that outputs the pixel signal read out from the readout circuit 30A to a signal processing unit outside the imaging device 100. Similarly, the output circuit 70B is a circuit unit that outputs the pixel signal read out from the readout circuit 30B to a signal processing unit outside the imaging device 100. Each of the output circuits 70A and 70B is formed of a buffer amplifier, a differential amplifier, or the like.

The control circuit 60 is a circuit unit that supplies control signals used for controlling the operation of the vertical scanning circuit 20, the readout circuits 30A and 30B, and the horizontal scanning circuits 50A and 50B or the timing thereof. Some or all of the control signals supplied to the vertical scanning circuit 20, the readout circuit 30A and 30B, and the horizontal scanning circuits 50A and 50B may be supplied from the outside of the imaging device 100.

Note that, while the two readout circuits 30A and 30B and the two horizontal scanning circuits 50A and 50B are provided and arranged at opposite positions interposing the pixel region 10, respectively, in the example of FIG. 1, each two such circuits may not be necessarily required to be provided. One readout circuit and one horizontal scanning circuit may be arranged on only one edge side of the pixel region 10.

Each of the pixels 12 includes photoelectric conversion units PC1, PC2, and PC3, transfer transistors M11, M12, and M13, a reset transistor M2, an amplifier transistor M3, a select transistor M4, and a capacitor C, as illustrated in FIG. 2, for example. The transfer transistors M11, M12, and M13, the reset transistor M2, the amplifier transistor M3, the select transistor M4, and the capacitor C form a readout circuit within the pixel 12.

The photoelectric conversion unit PC1 includes a first electrode 111, a blocking layer 121, a photoelectric conversion layer 131, an insulating layer 141, and a second electrode 151. The first electrode 111 is an upper electrode, for example, and the second electrode 151 is a lower electrode, for example. The photoelectric conversion layer 131 is arranged between the first electrode 111 and the second electrode 151. The blocking layer 121 is arranged between the first electrode 111 and the photoelectric conversion layer 131. The insulating layer 141 is arranged between the photoelectric conversion layer 131 and the second electrode 151. The first electrode 111 is included in a node A (denoted as "node A" in FIG. 2) supplied with a voltage Vs. The second electrode 151 is connected to a node B (denoted as "node B" in FIG. 2) via the transfer transistor M11.

Similarly, the photoelectric conversion unit PC2 includes a first electrode 112, a blocking layer 122, a photoelectric conversion layer 132, an insulating layer 142, and a second electrode 152. The photoelectric conversion layer 132 is arranged between the first electrode 112 and the second electrode 152. The blocking layer 122 is arranged between the first electrode 112 and the photoelectric conversion layer 132. The insulating layer 142 is arranged between the photoelectric conversion layer 132 and the second electrode 152. The first electrode 112 is included in the node A. The second electrode 152 is connected to the node B via the transfer transistor M12.

Further, the photoelectric conversion unit PC3 includes a first electrode 113, a blocking layer 123, a photoelectric conversion layer 133, an insulating layer 143, and a second electrode 153. The photoelectric conversion layer 133 is arranged between the first electrode 113 and the second electrode 153. The blocking layer 123 is arranged between the first electrode 113 and the photoelectric conversion layer 133. The insulating layer 143 is arranged between the photoelectric conversion layer 133 and the second electrode 153. The first electrode 113 is included in the node A. The second electrode 153 is connected to the node B via the transfer transistor M13.

The mode B includes the gate of the amplifier transistor M3. The amplifier transistor M3 is an amplifier unit, and the gate of the amplifier transistor M3 is an input node of the amplifier unit. That is, the second electrodes 151, 152, and 153 of the photoelectric conversion units PC1, PC2, and PC3 are electrically connected to the amplifier unit via the transfer transistors M11, M12, and M13. The node B also includes a first terminal of the capacitor C. A second terminal of the capacitor C is included in a node C (denoted as "node C" in FIG. 2). The second terminal is capacitively coupled to the first terminal. In another point of view, the node C is capacitively coupled to the node B via the capacitor C. The second terminal (node C) of the capacitor C is supplied with a predetermined voltage (for example, a reference voltage).

The drain of the reset transistor M2 is supplied with a reset voltage Vres.

The source of the reset transistor M2 is connected to the node B. The drain of the amplifier transistor M3 is connected to a node supplied with a power source voltage Vdd. The source of the amplifier transistor M3 is connected to the output line 16 (the output line 16A or the output line 16B) via the select transistor M4. A current source 18 is connected to the output line 16. Thereby, the amplifier transistor M3 and the current source 18 form a source follower circuit.

In the case of the pixels 12 configured as illustrated in FIG. 2, the control line 14 on each row includes a signal line that supplies a control signal PTX1, a signal line that supplies a control signal PTX2, a signal line that supplies a control signal PTX3, a signal line that supplies a control signal PRES, and a signal line that supplies a control signal PSEL. The control signals PTX1, PTX2, PTX3, PRES, and PSEL are supplied from the vertical scanning circuit 20 to the pixel 12 via the control line 14.

In the photoelectric conversion unit PC1, accumulation of signal charges and draining of signal charges are controlled in accordance with the magnitude relationship between the voltage Vs supplied to the first electrode 111 and the reset voltage Vres supplied to the second electrode 151 from the node B via the transfer transistor M11. The same applies to the photoelectric conversion units PC2 and PC3. By properly controlling the transfer transistors M11, M12, and M13, it is possible to select the photoelectric conversion unit PC1, PC2, or PC3 which accumulates signal charges or drains signal charges. Note that draining of signal charges is performed for reading out signal charges generated by the photoelectric conversion unit PC1, PC2, or PC3.

Further, once the reset transistor M2 is turned on, the voltage of the node B can be reset to the reset voltage Vres. When the transfer transistors M11, M12, or M13 is turned on in this state, the reset voltage Vres can be supplied to the second electrode 151, 152, or 153. When the reset transistor M2 is turned off, the node B is electrically floated.

With such a configuration, a signal based on signal charges generated by the photoelectric conversion unit PC1, PC2, or PC3 can be amplified by the amplifier unit and output to the output line 16.

Note that the pixel 12 is not limited to the circuit illustrated as an example in FIG. 2 as long as it is configured to be able to read out signals based on signal charges generated by the photoelectric conversion units PC1, PC2, and PC3 that share a single microlens, respectively. For example, readout circuits may be connected to the photoelectric conversion units PC1, PC2, and PC3, respectively, or a single readout circuit may be shared by photoelectric conversion units of a plurality of pixels 12. Further, one of the signals of the photoelectric conversion unit PC1 and the photoelectric conversion unit PC3 may be read out as a signal that sums the other signal of the photoelectric conversion unit PC1 and the photoelectric conversion unit PC3. Further, signal charges generated by the photoelectric conversion units PC1, PC2, and PC3 may be electrons or may be holes.

FIG. 3A is a schematic cross-sectional view of one of the pixels 12. Each pixel 12 includes a semiconductor substrate 210, an interconnection portion 220, the photoelectric conversion units PC1, PC2, and PC3, color filters 231, 232, and 233, and a microlens 240.

On the semiconductor substrate 210, semiconductor elements including the transfer transistors M11, M12, and M13, the reset transistor M2, the amplifier transistor M3, and the select transistor M4 (each not illustrated) are provided. The interconnection portion 220 is provided on the semiconductor substrate 210. The interconnection portion 220 includes interconnection layers in which interconnection patterns used for electrically connecting elements to each other or signal lines are provided (not illustrated), an insulating layer used for insulating the interconnection layers from each other (not illustrated), or the like. The capacitor C is formed of line-to-line capacitance of interconnections, for example.

The second electrodes 151, 152, and 153 are provided on the interconnection portion 220. The photoelectric conversion layer 130 is provided on the second electrodes 151, 152, and 153. The first electrode 110 is provided on the photoelectric conversion layer 130. Thereby, the first photoelectric conversion unit PC1 including the first electrode 110, the photoelectric conversion layer 130, and the second electrode 151 are arranged. Further, the second photoelectric conversion unit PC2 including the first electrode 110, the photoelectric conversion layer 130, and the second electrode 152 is arranged. Further, the third photoelectric conversion unit PC3 including the first electrode 110, the photoelectric conversion layer 130, and the second electrode 153 is arranged.

A portion between the first electrode 110 and the second electrode 151 of the photoelectric conversion layer 130 corresponds to the photoelectric conversion layer 131 of the photoelectric conversion unit PC1. Similarly, a portion between the first electrode 110 and the second electrode 152 of the photoelectric conversion layer 130 corresponds to the photoelectric conversion layer 132 of the photoelectric conversion unit PC2. Similarly, a portion between the first electrode 110 and the second electrode 153 of the photoelectric conversion layer 130 corresponds to the photoelectric conversion layer 133 of the photoelectric conversion unit PC3. The first electrode 110 is a common electrode that also serves as the first electrode 111 of the photoelectric conversion unit PC1, the first electrode 112 of the photoelectric conversion unit PC2, and the first electrode 113 of the photoelectric conversion unit PC3. The second electrodes 151, 152, and 153 are individual electrodes of the photoelectric conversion units PC1, PC2, and PC3 electrically separated from each other.

The first electrode 110 is used for applying a voltage with respect to the second electrodes 151, 152, and 153 to generate an electric field inside the photoelectric conversion layer 130. Because of being provided on the light incident surface side of the photoelectric conversion layer 130, the first electrode 110 is formed of a conductive material such as ITO, for example, which is transparent to the incident light. The photoelectric conversion layer 130 is formed of an inorganic compound material or an organic compound material that generates charges in accordance with the light mount of an incident light. The second electrodes 151, 152, and 153 are for separating and collecting charges generated in each region of the photoelectric conversion layer 130. Each of the second electrodes 151, 152, and 153 is a thin film electrode and is formed of a conductive material such as aluminum (Al), cupper (Cu), or the like.

The color filters 231, 232, and 233 are arranged on the photoelectric conversion units PC1, PC2, and PC3, respectively. The color filters 231, 232, and 233 are arranged such that a light which has passed through the color filter 231 enters the photoelectric conversion unit PC1, a light which has passed through the color filter 232 enters the photoelectric conversion unit PC2, and a light which has passed through the color filter 233 enters the photoelectric conversion unit PC3.

Each transmittance of the color filter 231 and the color filter 233 is different from the transmittance of the color filter 232. In one example, each transmittance of the color filter 231 and the color filter 233 is larger than the transmittance of the color filter 232. For example, the color filter 232 is a filter that transmits lights of red (R), green (G), or blue (B) or cyan (C), magenta (M), or yellow (Y). On the other hand, each of the color filters 231 and 233 is a color filter of white (W) and has a larger transmittance than the color filter 232. Note that a transmittance as used herein is a transmittance that is integrated for a wavelength region of a light entering the pixel 12. One of the methods of increasing the transmittance of a color filter may be to increase a peak value of the spectral transmittance of the color filter. Further, when considering a graph of spectral transmittance characteristics whose horizontal axis is the wavelength and vertical axis is the transmittance, a use of a material having a spectral transmittance property in which the transmission wavelength band width is wider can increase the transmittance integrated for a wavelength region.

The microlens 240 that collects light to the photoelectric conversion units PC1, PC2, and PC3 is arranged on the color filters 231, 232, and 233. Each microlens 240 is arranged for each one pixel 12. In other words, the three photoelectric conversion units PC1, PC2, and PC3 of a single pixel 12 share a single microlens 240. Alternatively, a single pixel 12 is formed by the three photoelectric conversion units PC1, PC2, and PC3 sharing a single microlens 240. The microlens 240 is formed of a resin material, for example.

Note that, in FIG. 3A, depiction of some components including the blocking layers 121, 122, and 123, the insulating layers 141, 142, and 143, or the like of the photoelectric conversion units PC1, PC2, and PC3 is omitted for simplicity. A planarization layer may be provided between the color filters 231, 232, and 233 and the microlens 240.

FIG. 3B is a plan view of the second electrodes 151, 152, and 153 projected on a plane parallel to the surface of the semiconductor substrate 210. FIG. 3C is a plan view of the color filters 231, 232, and 233 projected on a plane parallel to the surface of the semiconductor substrate 210. When the coordinate system illustrated in each of FIG. 3A to FIG. 3C is assumed, the surface of the semiconductor substrate 210 is parallel to the xy-plane, and the normal direction of the semiconductor substrate 210 is parallel to the z-axis. The cross-sectional view in a plane parallel to the xz-plane including the line A-A' of FIG. 3B and FIG. 3C corresponds to FIG. 3A. Note that the x-direction corresponds to the row direction, for example, and the y-direction corresponds to the column direction, for example.

As illustrated in FIG. 3B, the second electrodes 151, 152, and 153, that is, the photoelectric conversion units PC1, PC2, and PC3 are arranged in this order in the x-direction. Further, the second electrode 151 and the second electrode 153, that is, the photoelectric conversion unit PC1 and the photoelectric conversion unit PC3 are arranged spaced apart in the x-direction. The second electrode 152, that is, the photoelectric conversion unit PC2 is arranged between the second electrode 151 and the second electrode 153, that is, between the photoelectric conversion unit PC1 and the photoelectric conversion unit PC3. Further, as illustrated in FIG. 3B and FIG. 3C, the color filter 231 is located over the second electrode 151, the color filter 232 is located over the second electrode 152, and the color filter 233 is located over the second electrode 153. Thereby, a light which has passed through the color filter 231 enters the photoelectric conversion unit PC1, a light which has passed through the color filter 232 enters the photoelectric conversion unit PC2, and a light which has passed through the color filter 233 enters the photoelectric conversion unit PC3.

As illustrated in FIG. 4A, a state where a light from an object 260 passes through an exit pupil 250 of a capturing lens and enters the pixel 12 is assumed here. The light axis of a light entering the pixel 12 is substantially parallel to the z-axis in the coordinate system illustrated in each of FIG. 3A to FIG. 4B.

The exit pupil 250 of a capturing lens and the photoelectric conversion layer 130 are in a conjugate relationship via the microlens 240. When pupil regions 251, 252, and 253 pupil-divided in the x-direction are assumed here for the exit pupil 250 as illustrated in FIG. 4B, the light which has passed through the pupil region 251 enters the photoelectric conversion unit PC1, and the light which has passed through the pupil region 253 enters the photoelectric conversion unit PC3 as illustrated in FIG. 4A. Further, as illustrated in FIG. 5, the light which has passed through the pupil region 252 enters the photoelectric conversion unit PC2.

The photoelectric conversion unit PC1 outputs a signal based on charges that are generated by a light which has passed through the pupil region 251 at the photoelectric conversion layer 130 (the photoelectric conversion layer 131) of a portion located above the second electrode 151 and are collected via the second electrode 151. Similarly, the photoelectric conversion unit PC2 outputs a signal based on charges that are generated by a light which has passed through the pupil region 252 at the photoelectric conversion layer 130 (the photoelectric conversion layer 132) of a portion located above the second electrode 152 and are collected via the second electrode 152. Further, the photoelectric conversion unit PC3 outputs a signal based on charges that are generated by a light which has passed through the pupil region 253 at the photoelectric conversion layer 130 (the photoelectric conversion layer 133) of a portion located above the second electrode 153 and are collected via the second electrode 153.

The output signal of the photoelectric conversion unit PC1 and the output signal of the photoelectric conversion unit PC3 are signals based on lights which has passed through the pupil regions 251 and 253 pupil-divided in the x-direction and includes phase difference information in the x-direction. Therefore, from a parallax image based on these two signals, the distance to the object 260 or a defocus amount can be measured by using the principle of triangulation. Further, a captured image of the object 260 can be acquired from the output signal of the photoelectric conversion unit PC2.

Next, the advantages of the imaging device according to the present embodiment will be described with comparison to an imaging device according to a reference example. FIG. 6A to FIG. 6C are schematic cross-sectional views of the structure of the imaging device according to the reference example. FIG. 7A and FIG. 7B are diagrams illustrating the positional relationship of a photoelectric conversion unit of each pixel and an exit pupil of a capturing lens in the imaging device according to the reference example.

In the imaging device according to the reference example, as illustrated in FIG. 6A to FIG. 6C, each pixel 12 includes the semiconductor substrate 210, the interconnection portion 220, two photoelectric conversion units PC1 and PC3, one type of color filter 230, and a microlens 240. The imaging device according to the reference example is basically the same as the imaging device according to the present embodiment except for the difference in the number of photoelectric conversion units and color filters.

As illustrated in FIG. 7A, the exit pupil 250 of the capturing lens and the photoelectric conversion layer 130 are in a conjugate relationship via the microlens 240. The pupil regions 271 and 273 pupil-divided in the x-direction are assumed here for the exit pupil 250 as illustrated in FIG. 7B, a light which has passed through the pupil region 271 enters the photoelectric conversion unit PC1, and a light which has passed through the pupil region 273 enters the photoelectric conversion unit PC3, as illustrated in FIG. 7A.

The photoelectric conversion unit PC1 outputs a signal based on charges that are generated by a light which has passed through the pupil region 271 at the photoelectric conversion layer 130 of a portion located above the second electrode 151 and are collected via the second electrode 151. Similarly, the photoelectric conversion unit PC3 outputs a signal based on charges that are generated by a light which has passed through the pupil region 273 at the photoelectric conversion layer 130 of a portion located above the second electrode 153 and are collected via the second electrode 153.

The output signal of the photoelectric conversion unit PC1 and the output signal of the photoelectric conversion unit PC3 are signals based on lights which have passed through the pupil regions 271 and 273 pupil-divided in the x-direction and include phase difference information in the x-direction. Therefore, from a parallax image based on these two signals, the distance to the object 260 or a defocus amount can be measured by using the principle of triangulation.

In terms of improved ranging accuracy, however, it is desirable to increase the distance between the centroids of the two divided pupil regions for increasing a parallax. From such a point of view, in the imaging device according to the present embodiment, the photoelectric conversion units PC1 and PC3 are arranged at both ends of the pixel 12 in the x-direction. Further, with the aperture of a lens being opened, namely, set to an open F value, for example, the distance L1 between the centroid of the pupil region 251 and the centroid of the pupil region 253 (each denoted as the x-mark in FIG. 4B) is increased. With such a configuration, the distance L1 between the centroid of the pupil region 251 and the centroid of the pupil region 253 is larger than the distance L2 between the centroid of the pupil region 271 and the centroid of the pupil region 273 (each denoted as the x-mark in FIG. 7B) in the imaging device according to the reference example.

Further, when considering application to an on-vehicle ranging camera or the like, it is important to improve detection sensitivity of a ranging signal in order to accurately range also at night. Accordingly, in the imaging device according to the present embodiment, the color filters 231 and 233 having a high transmittance such as white are arranged over the photoelectric conversion units PC1 and PC3, and thereby the detection sensitivity of a ranging signal is improved.

On the other hand, with a lens aperture being opened, namely, set to the open F value, for example, the depth of field becomes shallower, and it is difficult to focus on the entire captured region. Therefore, this is not desirable as an imaging device mounted on a vehicle in which it is demanded to capture an image without causing out-of-focus from a close object to a distant object. Accordingly, the imaging device according to the present embodiment is configured to be able to separately read out, as an imaging signal, a signal from the photoelectric conversion unit PC2 arranged at and around the center of the pixel 12, so that the pupil region 252 through which a light flux used for acquisition of an imaging signal passes is restricted to a region on and around the light axis. Such a configuration can reduce the substantial aperture value in the x-direction and prevent the depth of field from being shallower in the x-direction even when the lens aperture is set to the open F value, for example. Further, a light received by the photoelectric conversion unit PC2 is a light that has passed through the color filter 232, and color information needed for image capturing can be acquired therefrom.

In the above description, the case where the color filter 231 and the color filter 232 are white and the color filter 232 is any one of RGB or CMY has been illustrated as an example. However, the color filters 231, 232, and 233 are not limited to such a combination.

For example, the color filters 231, 232, and 233 may be color filters of the same color, and the transmittance of the color filters 231 and 233 may be larger than the transmittance of the color filter 232. In this case, color information can be acquired also from the ranging signal output from the photoelectric conversion units PC1 and PC3. Further, by combining the output signals from the photoelectric conversion units PC1, PC2, and PC3, it is possible to acquire a captured image at the open F value.

Further, in the above description, the case where the transmittance of the color filters 231 and 233 is larger than the transmittance of the color filter 232 in terms of prioritizing the sensitivity of ranging has been illustrated as an example. However, when the sensitivity of image capturing is prioritized or the like, for example, the transmittance of the color filter 232 may be larger than the transmittance of the color filters 231 and 233.

For example, the color filters 231, 232, and 233 may be color filters of the same color, and the transmittance of the color filter 232 may be larger than the transmittance of the color filters 231 and 233. With such a configuration, a ranging signal having a high ranging accuracy can be acquired, and an imaging signal having a deep depth of field can be acquired at high sensitivity.

Further, while the case where the transmittance of the color filter 231 and the transmittance of the color filter 233 are the same has been described above as an example, these transmittances may be different. With such a configuration, two types of images having different sensitivities can be acquired for a portion where an image which can be acquired by the photoelectric conversion unit PC1 overlaps with an image which can be acquired by the photoelectric conversion unit PC3. It is therefore possible to generate an HDR image by performing a combining process on the two types of images.

Further, a color filter of not only white, RGB, or CMY but also IR (infrared) may be used for the color filters 231, 232, and 233.

As discussed above, according to the present embodiment, a ranging signal having a high ranging accuracy and an imaging signal having a deep depth of field can be acquired.

Second Embodiment

Figure 8A:
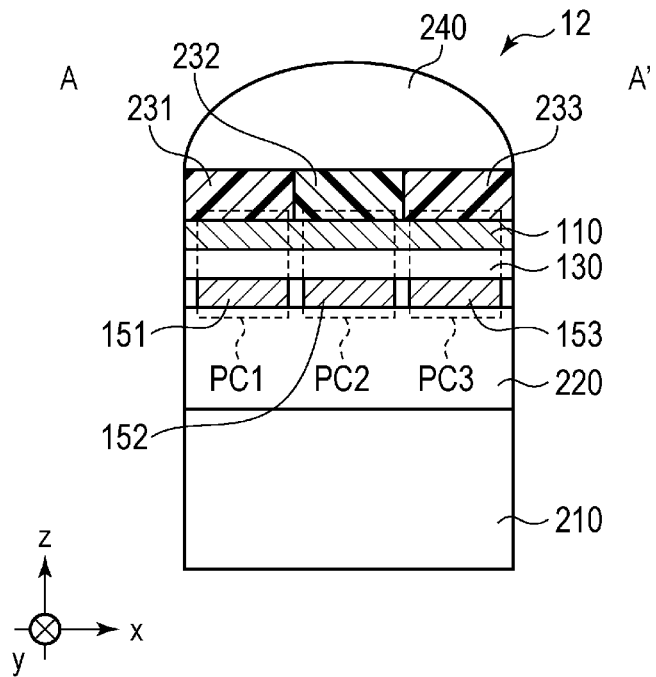
FIG. 8A is a cross-sectional view illustrating the structure of a pixel of an imaging device according to a second embodiment of the present invention.
Figure 8B:
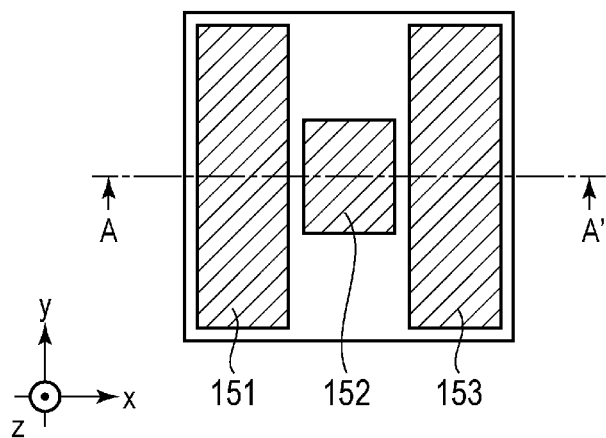
FIG. 8B and FIG. 8C are plan views illustrating the structure of the pixel of the imaging device according to the second embodiment of the present invention.
Figure 8C:
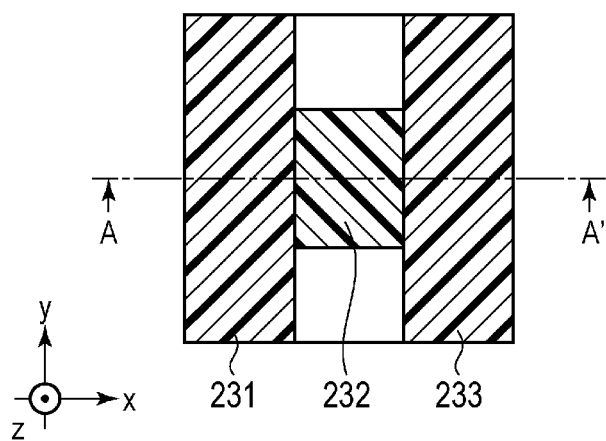
Figure 10A:
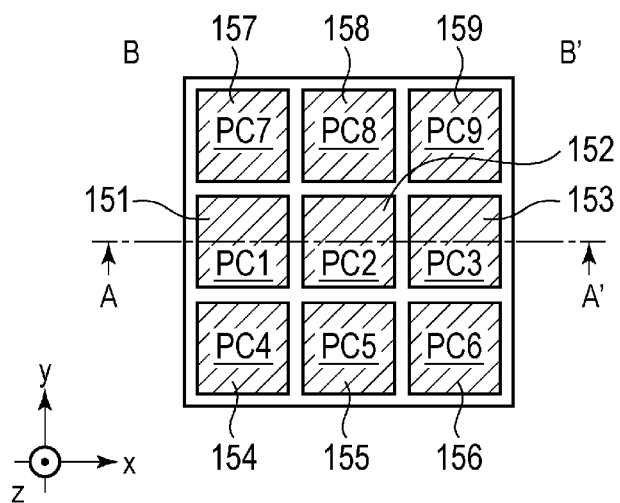
FIG. 10A and FIG. 10B are plan views illustrating the structure of a pixel of an imaging device according to a modified example of the second embodiment of the present invention.
Figure 10B:
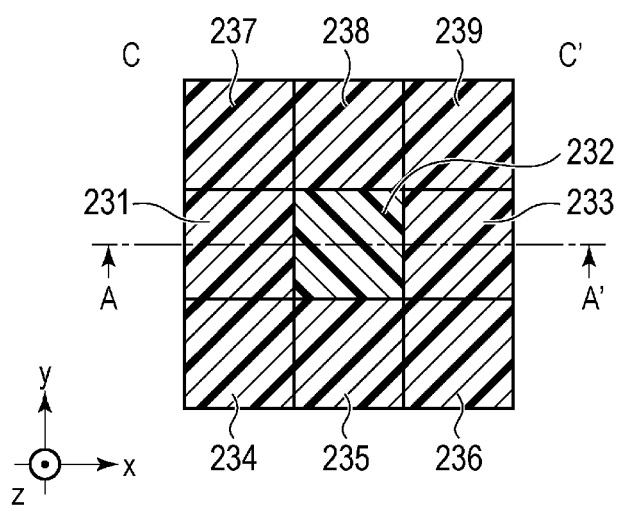

An imaging device according to a second embodiment of the present invention will be described with reference to FIG. 8A to FIG. 10B. The same components as those of the imaging device according to the first embodiment are labeled with the same reference numerals, and the description thereof will be omitted or simplified. FIG. 8A to FIG. 8C are a cross-sectional view and plan views illustrating the structure of a pixel of the imaging device according to the present embodiment. FIG. 9A and FIG. 9B are diagrams illustrating positional relationships of a photoelectric conversion unit of each pixel and an exit pupil of a capturing lens in the imaging device according to the present embodiment. FIG. 10A and FIG. 10B are plan views illustrating the structure of a pixel of an imaging device according to a modified example of the present embodiment.

As illustrated in FIG. 8A to FIG. 8C, the imaging device according to the present embodiment is the same as the imaging device according to the first embodiment except for a difference in the configuration of the second electrode 152 of the photoelectric conversion unit PC2 and the color filter 232 corresponding to the photoelectric conversion unit PC2.

That is, in the imaging device according to the present embodiment, the length in the y-direction of the second electrode 152 of the photoelectric conversion unit PC2 is shorter than the length in the y-direction of the second electrodes 151 and 153, as illustrated in FIG. 8B. The second electrode 152 is arranged at and around the center of the pixel 12 in a planer view (plane parallel to the xy-plane). The length in the y-direction of the second electrode 152 corresponds to the length in the y-direction of the photoelectric conversion unit PC2. Further, the length in the y-direction of the color filter 232 is shorter than the length in the y-direction of the color filters 231 and 233, as illustrated in FIG. 8C. The color filter 232 is arranged at and around the center of the pixel 12 in a planar view (plane parallel to the xy-plane). The cross-sectional structure taken along the line A-A' of FIG. 8B and FIG. 8C is the same as that of the imaging device according to the first embodiment, as illustrated in FIG. 8A.

As illustrated in FIG. 9A, a state where a light from the object 260 passes through the exit pupil 250 of the capturing lens and enters the pixel 12 is assumed here. The light axis of the light entering the pixel 12 is substantially parallel to the z-axis in the coordinate system illustrated in each of FIG. 8A to FIG. 9B.

Since the exit pupil 250 of the capturing lens and the photoelectric conversion layer 130 are in a conjugate relationship via the microlens 240, in the imaging device of the present embodiment having a short length in the y-direction of the photoelectric conversion unit PC2, the length in the y-direction of the pupil region 252 is also short as illustrated in FIG. 9B. That is, in the imaging device according to the present embodiment, the pupil region 252 through which the light flux entering the photoelectric conversion unit PC2 passes can be restricted to a part on or around the optical axis not only in the x-direction but also in the y-direction. Therefore, even when the lens aperture value is set to the open F value, for example, it is possible to reduce the substantial aperture value in the x-direction and the y-direction and prevent the depth of field from being shallower in the x-direction and the y-direction. According to the imaging device of the present embodiment, an imaging signal having a deep depth of field not only in the x-direction but also in the y-direction can be acquired.

The vacant space caused by the shortened length in the y-direction of the photoelectric conversion unit PC2 can be utilized as a place where a photoelectric conversion unit for acquiring a ranging signal is arranged.

FIG. 10A and FIG. 10B are a configuration example when nine photoelectric conversion units PC1 to PC9 of three rows by three columns are provided in each pixel 12. FIG. 10A is a plan layout view of second electrodes 151 to 159, and FIG. 10B is a plan layout view of color filters 231 to 239.

In the layout illustrated in FIG. 10A and FIG. 10B, for example, an imaging signal is acquired from the photoelectric conversion unit PC2 and a ranging signal can be acquired from the photoelectric conversion units PC1 and PC3 to PC9. In this case, it is configured such that the transmittance of the color filter 232 and the transmittance of the color filters 231 and 233 to 239 are different from each other. For example, the color filter 232 is an RGB color filter, and the color filters 231 and 233 to 239 are white color filters having a high transmittance.

Note that summing and reading out signals from the photoelectric conversion units PC1, PC4, and PC7 in the layout illustrated in FIG. 10A and FIG. 10B corresponds to reading out a signal from the photoelectric conversion unit PC1 in the first or second embodiment. Further, summing and reading out signals from the photoelectric conversion units PC3, PC6, and PC9 corresponds to reading out a signal from the photoelectric conversion unit PC3 in the first or second embodiment.

Further, with the layout illustrated in FIG. 10A and FIG. 10B, since a plurality of photoelectric conversion units are arranged not only in the x-direction but also in the y-direction within a single pixel 12, this enables not only ranging utilizing phase difference information in the x-direction but also ranging utilizing phase difference information in the y-direction. For example, the distance to the object 260 or the defocus amount can be measured from a parallax image based on an output signal from photoelectric conversion unit PC5 and an output signal from the photoelectric conversion unit PC8. Since any signal to be read out from the photoelectric conversion units PC1 to PC9 can be selected, it is possible to utilize phase difference information in a direction oblique relative to the x-direction and the y-direction for ranging.

As discussed above, according to the present embodiment, a ranging signal having a high ranging accuracy and an imaging signal having a deep depth of field can be acquired.

Third Embodiment

Figure 11:
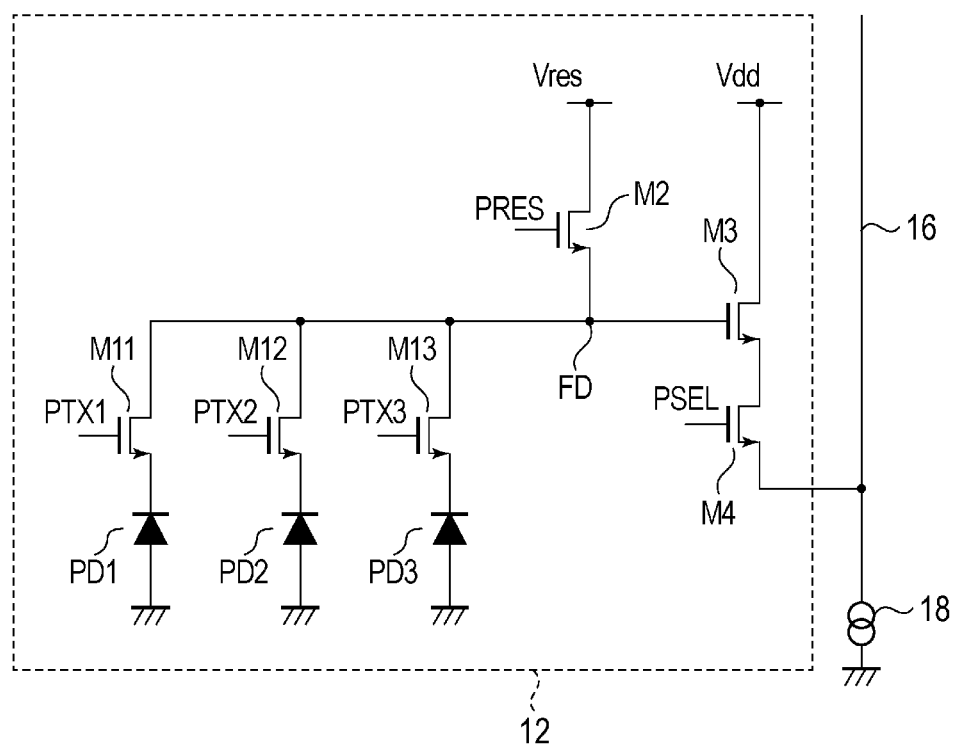
FIG. 11 is a circuit diagram illustrating a configuration example of a pixel of an imaging device according to a third embodiment of the present invention.

An imaging device according to a third embodiment of the present invention will be described with reference to FIG. 11 to FIG. 12C. The same components as those of the imaging device according to the first and second embodiments are labeled with the same reference numerals, and the description thereof will be omitted or simplified. FIG. 11 is a circuit diagram illustrating a configuration example of a pixel of the imaging device according to the present embodiment. FIG. 12A to FIG. 12C are a cross-sectional view and plan views illustrating the structure of a pixel of the imaging device according to the present embodiment.

While the examples applied to a so-called stacked type imaging device in which photoelectric conversion units are arranged above the semiconductor substrate 210 provided with semiconductor elements have been described in the first and second embodiments, the present invention is applicable to the imaging device in which photoelectric conversion units are provided in a semiconductor substrate. In the present embodiment, an example applied to an imaging device in which photoelectric conversion units are provided in a semiconductor substrate will be described.

As illustrated in FIG. 11, for example, the pixel 12 of the imaging device according to the present embodiment includes photoelectric conversion units PD1, PD2, and PD3, the transfer transistors M11, M12, and M13, the reset transistor M2, the amplifier transistor M3, and the select transistor M4. The transfer transistors M11, M12, and M13, the reset transistor M2, the amplifier transistor M3, and the select transistor M4 form a readout circuit within the pixel 12.

The photoelectric conversion units PD1, PD2, and PD3 each are a photodiode, for example. The anode of the photodiode of the photoelectric conversion unit PD1 is connected to a ground voltage terminal, and the cathode thereof is connected to the source of the transfer transistor M11. The anode of the photodiode of the photoelectric conversion unit PD2 is connected to the ground voltage terminal, and the cathode thereof is connected to the source of the transfer transistor M12. The anode of the photodiode of the photoelectric conversion unit PD3 is connected to the ground voltage terminal, and the cathode thereof is connected to the source of the transfer transistor M13. The drains of the transfer transistors M11, M12, and M13 are connected to the source of the reset transistor M2 and the gate of the amplifier transistor M3. A connection node of the drains of the transfer transistors M11, M12, and M13, the source of the reset transistor M2, and the gate of the amplifier transistor M3 is a so-called floating diffusion region (floating diffusion FD). The capacitance component parasitically coupled to the floating diffusion FD (floating diffusion capacitor) has a function as a holding portion of charges. The drain of the reset transistor M2 is connected to the power source voltage line (Vres). The drain of the amplifier transistor M3 is connected to the power source voltage terminal (Vdd). The source of the amplifier transistor M3 is connected to the drain of the select transistor M4. The source of the select transistor M4 is connected to the output line 16 (the output line 16A or the output line 16B).

The photoelectric conversion units PD1, PD2, and PD3 each convert (photoelectrically convert) an incident light into an amount of charges in accordance with the light amount and accumulate the generated charges. When turned on, the transfer transistors M11, M12, and M13 each transfer charges of the photoelectric conversion units PD1, PD2, and PD3 to the floating diffusion FD. The floating diffusion FD is caused to have a voltage in accordance with the amount of charges transferred from the photoelectric conversion units PD1, PD2, and PD3 through charge-to-voltage conversion due to the capacitance of the floating diffusion FD. The amplifier transistor M3 is configured such that the power source voltage Vdd is supplied to the drain and a bias current is supplied to the source from the current source 18 via the select transistor M4 and forms an amplifier unit whose gate is the input node (source follower circuit). Thereby, the amplifier transistor M3 outputs a signal based on a voltage of the floating diffusion FD to the output line 16 via the select transistor M4. When turned on, the reset transistor M2 resets the floating diffusion FD to a voltage in accordance with the reset voltage Vres.

Figure 12A:
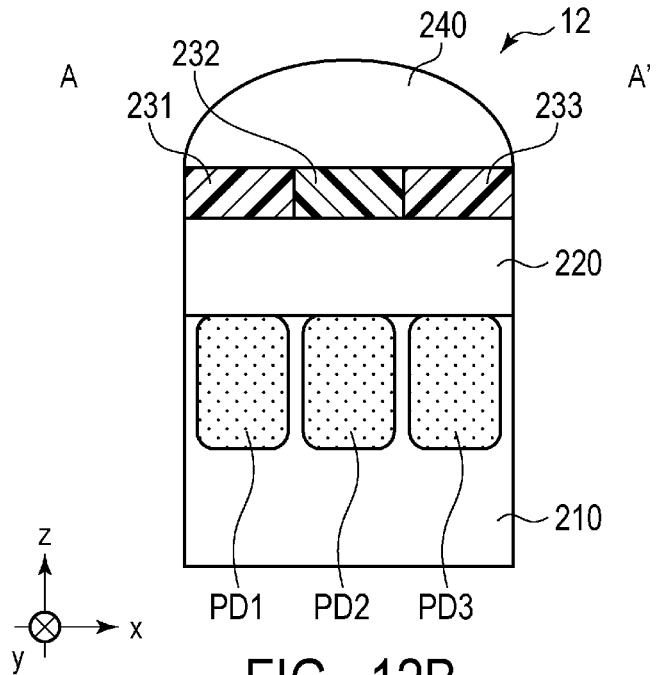
FIG. 12A is a plan view illustrating the structure of the pixel of the imaging device according to the third embodiment of the present invention.

FIG. 12A is a schematic cross-sectional view of a single pixel 12. Each pixel 12 includes the semiconductor substrate 210, the interconnection portion 220, the photoelectric conversion units PD1, PD2, and PD3, the color filters 231, 232, and 233, and the microlens 240.

In the semiconductor substrate 210, the photoelectric conversion units PD1, PD2, and PD3, the transfer transistors M11, M12, and M13, the reset transistor M2, the amplifier transistor M3, the select transistor M4, and the like are provided. FIG. 12A illustrates only the photoelectric conversion units PD1, PD2, and PD3 among the above. The interconnection portion 220 is provided on the semiconductor substrate 210. The color filters 231, 232, and 233 are arranged on the interconnection portion 220. The microlens 240 is arranged on the color filters 231, 232, and 233.

Figure 12B:
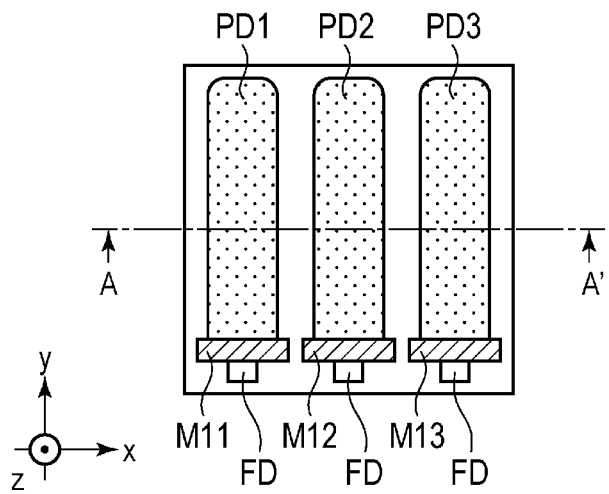
FIG. 12B and FIG. 12C are plan views illustrating the structure of the pixel of the imaging device according to the third embodiment of the present invention.

FIG. 12B is a plan view of the semiconductor substrate 210. FIG. 12B illustrates the semiconductor regions forming charge accumulation regions of the photoelectric conversion units PD1, PD2, and PD3 by using the reference numerals PD1, PD2, and PD3 of the corresponding photoelectric conversion units. Further, the gates of the transfer transistors M11, M12, and M13 are illustrated by reference numerals M11, M12, and M13 of the corresponding transfer transistors. FIG. 12C is a plan layout view of the color filters 231, 232, and 233.

Figure 12C:
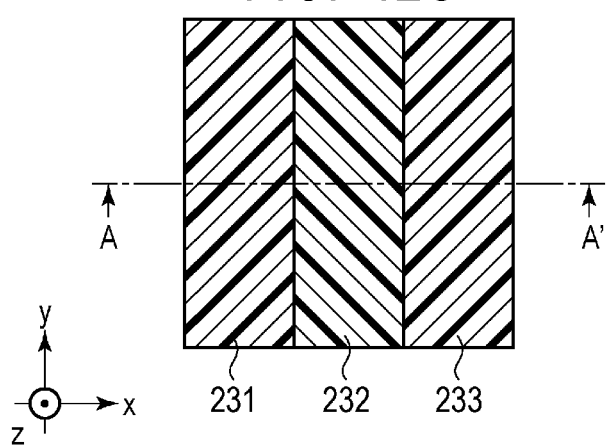

As illustrated in FIG. 12B and FIG. 12C, the color filter 231 is located over the photoelectric conversion unit PD1, the color filter 232 is located over the photoelectric conversion unit PD2, and the color filter 233 is located over the photoelectric conversion unit PD3. Thereby, it is configured such that a light which has passed through the color filter 231 enters the photoelectric conversion unit PD1, a light which has passed through the color filter 232 enters the photoelectric conversion unit PD2, and a light which has passed through the color filter 233 enters the photoelectric conversion unit PD3. Each transmittance of the color filter 231 and the color filter 233 is different from the transmittance of the color filter 232. In one example, each transmittance of the color filter 231 and the color filter 233 is larger than the transmittance of the color filter 232 in the same manner as in the first embodiment, for example. With such a configuration, a ranging signal having a high ranging accuracy can be acquired, and an imaging signal having a deep depth of field can be acquired in the same manner as in the first embodiment.

Note that, while the pixel 12 of the front side irradiation type in which the microlens 240 and the color filters 231, 232, and 233 are arranged on the front surface side is illustrated as an example in FIG. 12A to FIG. 12C, the pixel 12 of the backside irradiation type may be employed. In the pixel 12 of the backside irradiation type, the color filters 231, 232, and 233 and the microlens 240 are arranged on the backside of the semiconductor substrate 210 via an insulating film, and an incident light from the backside of the semiconductor substrate 210 is detected by the photoelectric conversion units PD1, PD2, and PD3.

As discussed above, according to the present embodiment, a ranging signal having a high ranging accuracy and an imaging signal having a deep depth of field can be acquired.

Fourth Embodiment

Figure 13:
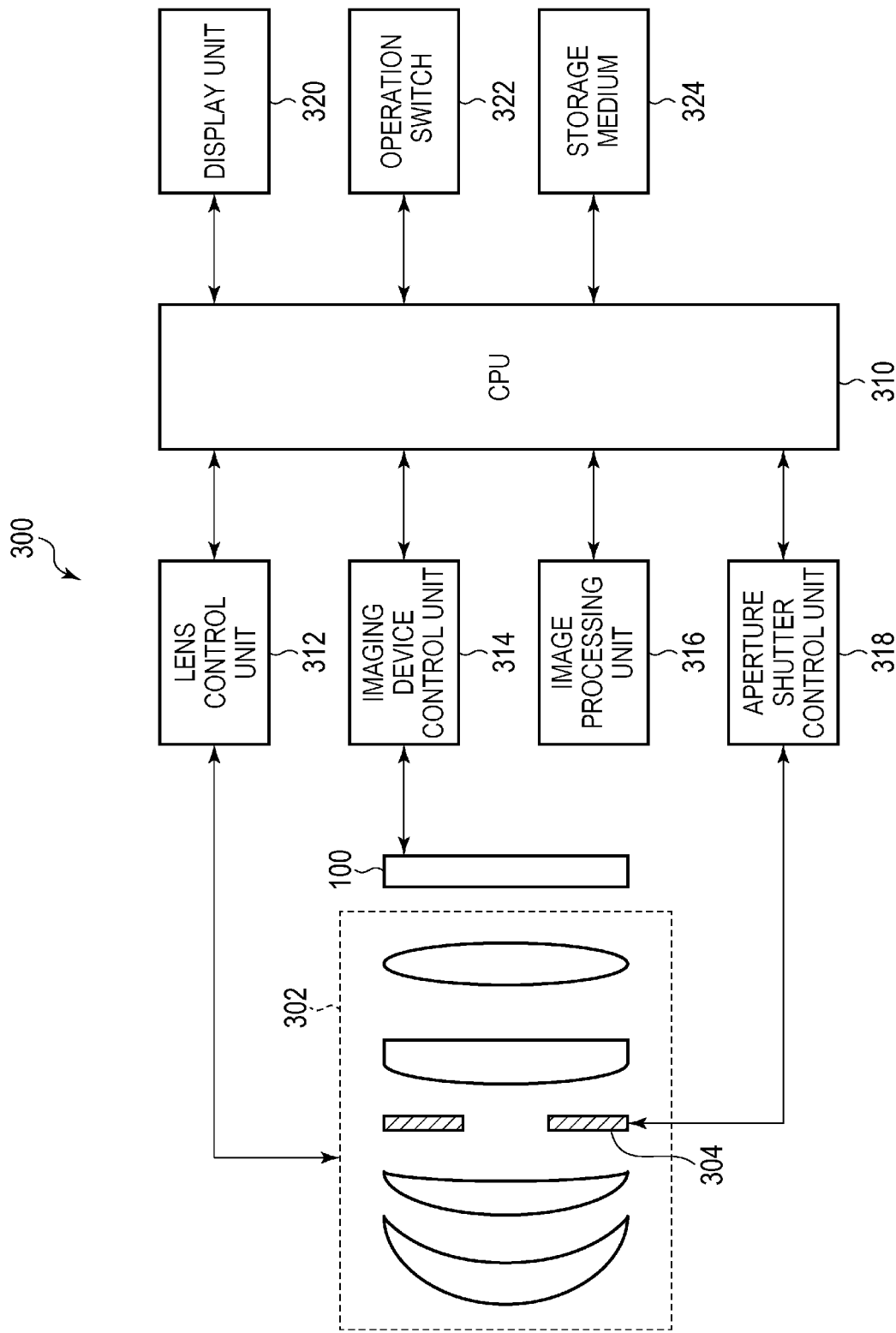
FIG. 13 is a block diagram illustrating a general configuration of an imaging system according to a fourth embodiment of the present invention.

An imaging system according to a fourth embodiment of the present invention will be described with reference to FIG. 13. FIG. 13 is a block diagram illustrating a general configuration of the imaging system according to the present embodiment.

The imaging device 100 described in the above first to third embodiments are applicable to various imaging systems. Although not limited in particular, an applicable imaging system may be, for example, a digital still camera, a digital camcorder, a surveillance camera, a copier machine, a fax machine, a mobile phone, an on-vehicle camera, an observation satellite, or the like. Further, a camera module having an optical system such as a lens and an imaging device is included in the imaging system. FIG. 13 illustrates a block diagram of a digital still camera as an example of the above.

As illustrated in FIG. 13, an imaging system 300 includes an imaging optical system 302, a CPU 310, a lens control unit 312, an imaging device control unit 314, an image processing unit 316, an aperture shutter control unit 318, a display unit 320, an operation switch 322, and a storage medium 324.

The imaging optical system 302 is an optical system for forming an optical image of an object and includes a group of lenses, an aperture 304, and the like. The aperture 304 has a function of performing a light amount adjustment at image capturing by adjusting the opening diameter thereof and, in addition, has a function as an exposure second/time adjusting shutter at static image capturing. The group of lenses and the aperture 304 are held so as to be retractable along the optical axis direction, and an interlocked operation thereof realizes a magnification function (zoom function) or a focus adjustment function. The imaging optical system 302 may be integrated with the imaging system or may be an imaging lens attachable to the imaging system.

In an image space of the imaging optical system 302, the imaging device 100 is arranged so that the image capturing plane thereof is located therein. The imaging device 100 is any of the imaging devices 100 described in the first to third embodiments and includes a CMOS sensor (the pixel region 10) and the peripheral circuit thereof (peripheral circuit region). In the imaging device 100, pixels having a plurality of photoelectric conversion units are two-dimensionally arranged, color filters are arranged to these pixels, and thereby a two-dimensional single plate color sensor is formed. The imaging device 100 photoelectrically converts an object image captured by the imaging optical system 302 and outputs it as an image signal or a focus detection signal.

The lens control unit 312 is for controlling retraction drive of the group of lenses of the imaging optical system 302 to perform magnification operation or focus adjustment and is formed of a circuit or a processing device configured to implement the function. The aperture shutter control unit 318 changes an opening diameter of the aperture 304 (with a variable aperture value) to adjust the captured light amount and is formed of a circuit or a processing device configured to implement the function.

The CPU 310 is an in-camera control device responsible for various control of the camera main unit and includes an operating unit, a ROM, a RAM, an analog-to-digital (A/D) converter, a digital-to-analog (D/A) converter, a communication interface circuit, or the like. The CPU 310 controls the operation of each unit within the camera in accordance with a computer program stored in the ROM or the like and executes a series of image capturing operation such as AF including detection of a focus state (focus detection) of the imaging optical system 302, image capturing, image processing, storage, or the like. The CPU 310 is also serves as a signal processing unit.

The imaging device control unit 314 is for controlling the operation of the imaging device 100 and performing A/D conversion on a signal output from the imaging device 100 for transmission to the CPU 310, and is formed of a circuit or a control device configured to implement these functions. The A/D conversion function may be included in the imaging device 100. The image processing unit 316 is for performing image processing such as gamma conversion or color interpolation on the digitally converted signal to generate an image signal and is formed of a circuit or a control device configured to implement the function. The display unit 320 is a display device such as a liquid crystal display device (LCD) and displays information on the capturing mode of a camera, a preview image before image capturing, an image for review after image capturing, a focus state at focus detection, or the like. The operation switch 322 is formed of a power switch, a release (image capturing trigger) switch, a zoom operation switch, a capturing mode selection switch, or the like. The storage medium 324 is for storing captured images or the like therein, which may be embedded in the imaging system or may be removable such as a memory card.

With the imaging system 300 to which any of the imaging devices 100 according to the first to third embodiments is applied being configured in such a way, a high performance imaging system that can perform accurate focus adjustment and acquire an image having a deep depth of field can be realized.

Fifth Embodiment

Figure 14A:
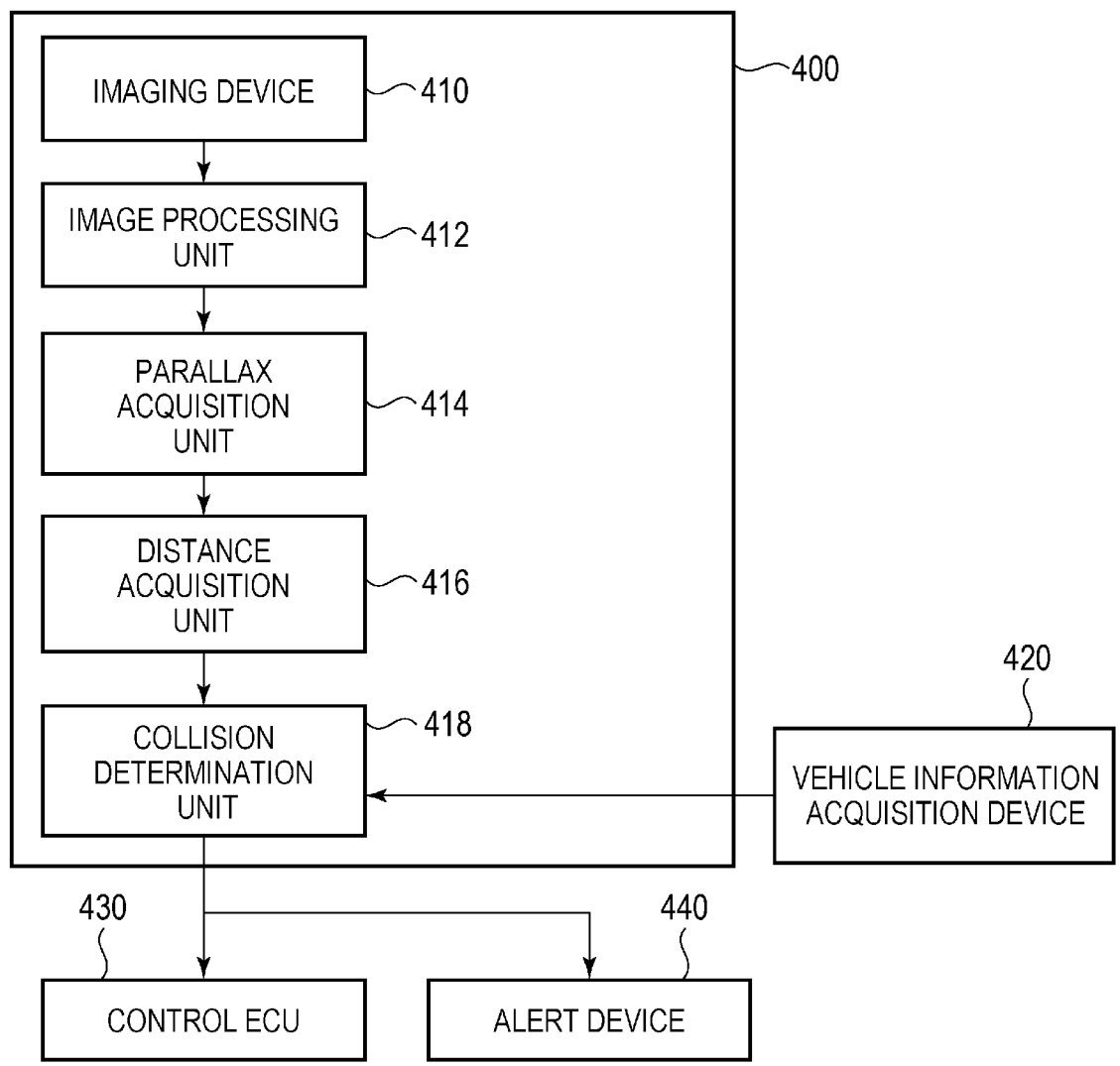
FIG. 14A is a diagram illustrating a configuration example of an imaging system according to a fifth embodiment of the present invention.
Figure 14B:
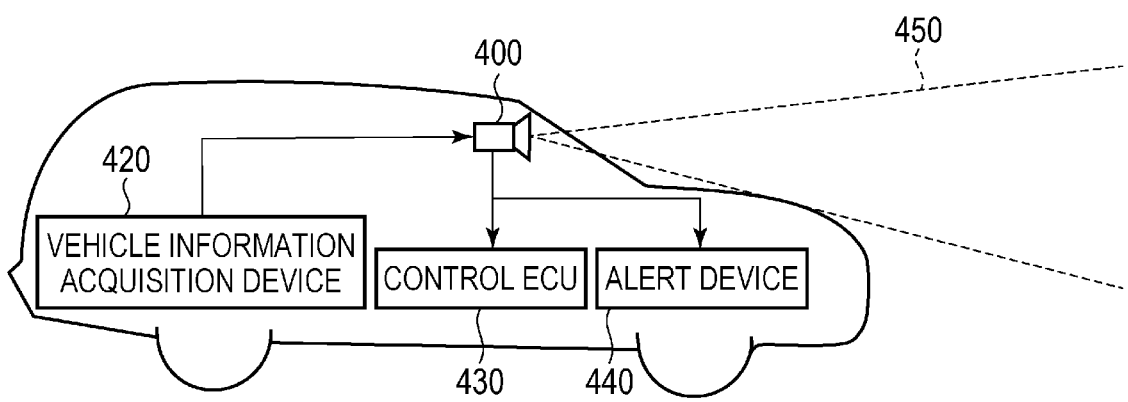
FIG. 14B is a diagram illustrating a configuration example of a movable object according to the fifth embodiment of the present invention.

An imaging system and a movable object according to a fifth embodiment of the present invention will be described with reference to FIG. 14A and FIG. 14B. FIG. 14A is a diagram illustrating a configuration of an imaging system according to the present embodiment. FIG. 14B is a diagram illustrating a configuration of a movable object according to the present embodiment.

FIG. 14A illustrates an example of an imaging system 300 related to an on-vehicle camera. The imaging system 300 includes an imaging device 310. The imaging device 310 is any of the imaging devices 100 described in respective embodiments described above. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging device 310. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. That is, the control ECU 330 is an example of a movable object control unit that controls a movable object based on the distance information. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 14B illustrates the imaging system 300 in a case of capturing a front area of a vehicle (a capturing area 350). The vehicle information acquisition device 320 transmits instructions to operate the imaging system 300 to perform capturing an image. A use of the imaging device 100 of each of the embodiments described above allows the imaging system 300 of the present embodiment to further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiment

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, while aligned in the x-direction in the first to third embodiments described above, the photoelectric conversion units PC1, PC2, and PC3 or the photoelectric conversion units PD1, PD2, and PD3 may be aligned in the y-direction.

Further, the circuit configuration of the pixel 12 is not limited to that illustrated in FIG. 2 or FIG. 11 and may be changed as appropriate.

Further, the imaging systems illustrated in the fourth and fifth embodiments are examples of an imaging system to which the imaging device of the present invention may be applied, and an imaging system to which the imaging device of the present invention can be applied is not limited to the configuration illustrated in FIG. 13 and FIG. 14A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-164104, filed Aug. 29, 2017, which is hereby incorporated by reference herein in its entirety.

What is claimed is:

1. An imaging device comprising:
    a plurality of pixels arranged over a plurality of rows and a plurality of columns,
    wherein each of the plurality of pixels includes
        a first photoelectric conversion unit;
        a second photoelectric conversion unit;
        a third photoelectric conversion unit;
        a microlens that collects light into the first photoelectric conversion unit, the second photoelectric conversion unit, and the third photoelectric conversion unit;
        a first color filter through which a light entering the first photoelectric conversion unit passes;
        a second color filter through which a light entering the second photoelectric conversion unit passes; and
        a third color filter through which a light entering the third photoelectric conversion unit passes,
    wherein the first photoelectric conversion unit, the second photoelectric conversion unit, and the third photoelectric conversion unit are arranged in this order in a first direction, and
    wherein a transmittance of the first color filter and a transmittance of the third color filter are different from a transmittance of the second color filter.

2. The imaging device according to claim 1,
    wherein the first photoelectric conversion unit and the third photoelectric conversion unit are arranged spaced apart from each other in the first direction, and
    wherein a length in a second direction intersecting the first direction of the second photoelectric conversion is shorter than the first photoelectric conversion unit and the third photoelectric conversion unit.

3. The imaging device according to claim 2, wherein each of the plurality of pixels further includes a fourth photoelectric conversion unit and a fifth photoelectric conversion unit arranged spaced apart from each other in the second direction so as to interpose the second photoelectric conversion unit, a fourth color filter through which a light entering the fourth photoelectric conversion unit passes, and a fifth color filter through which a light entering the fifth photoelectric conversion unit passes.

4. The imaging device according to claim 1, wherein the transmittance of the first color filter and the transmittance of the third color filter are larger than the transmittance of the second color filter.

5. The imaging device according to claim 1, wherein the transmittance of the first color filter and the transmittance of the third color filter are smaller than the transmittance of the second color filter.

6. The imaging device according to claim 1, wherein color of the first color filter and the third color filter is different from color of the second color filter.

7. The imaging device according to claim 6, wherein color of the first color filter and the third color filter is white.

8. The imaging device according to claim 1, wherein color of the first color filter and the third color filter is the same as color of the second color filter.

9. The imaging device according to claim 1, wherein the transmittance of the first color filter is the same as the transmittance of the third color filter.

10. The imaging device according to claim 1, wherein the transmittance of the first color filter is different from the transmittance of the third color filter.

11. The imaging device according to claim 1, wherein the microlens collects a light which has passed through a first pupil region of an exit pupil of a capturing lens into the first photoelectric conversion unit, collects a light which has passed through a third pupil region of the exit pupil region that is different from the first pupil region into the third photoelectric conversion unit, and collects a light which has passed through a second pupil region between the first pupil region and the third pupil region into the second photoelectric conversion unit.

12. The imaging device according to claim 1,
wherein each of the first photoelectric conversion unit, the second photoelectric conversion unit, and the third photoelectric conversion unit includes a first electrode, a second electrode, and a photoelectric conversion layer arranged between the first electrode and the second electrode, and
wherein the first electrodes of the first photoelectric conversion unit, the second photoelectric conversion unit, and the third photoelectric conversion unit are common electrodes, and the second electrodes of the first photoelectric conversion unit, the second photoelectric conversion unit, and the third photoelectric conversion unit are individual electrodes.

13. The imaging device according to claim 1, wherein the first photoelectric conversion unit, the second photoelectric conversion unit, and the third photoelectric conversion unit are provided in a semiconductor region.

14. An imaging system comprising:
the imaging device according to claim 1; and
a signal processing unit that processes a signal output from the imaging device.

15. A movable object comprising:
the imaging device according to claim 1;
a distance information acquisition unit that acquires, from a parallax image based on signals output from the pixels of the imaging device, distance information on a distance to an object; and
a control unit that controls the movable object based on the distance information.

\* \* \* \* \*